United States Patent [19]
Kim

[11] Patent Number: 5,975,402
[45] Date of Patent: Nov. 2, 1999

[54] STACKING AND SOLDERING APPARATUS FOR THREE DIMENSIONAL STACK PACKAGE DEVICES

[75] Inventor: Jae June Kim, Seoul, Rep. of Korea

[73] Assignee: Samsung Electronics Co., Ltd., Suwon City, Rep. of Korea

[21] Appl. No.: 08/771,197

[22] Filed: Dec. 20, 1996

[30] Foreign Application Priority Data

Dec. 30, 1995 [KR] Rep. of Korea ............... 95/68172

[51] Int. Cl.$^6$ .................... B23K 3/00; B23K 37/04
[52] U.S. Cl. ................. 228/6.2; 228/43; 228/49.5
[58] Field of Search .............. 228/6.2, 43, 49.1, 228/49.5

[56] References Cited

U.S. PATENT DOCUMENTS

| | | | |
|---|---|---|---|
| 3,475,805 | 11/1969 | Rottmann ........................ | 228/6.2 |
| 3,946,931 | 3/1976 | Bahnck et al. ................... | 228/6.2 |
| 4,602,417 | 7/1986 | Mesch et al. .................... | 228/49.5 |

*Primary Examiner*—Patrick Ryan
*Assistant Examiner*—Jeffrey T. Knapp
*Attorney, Agent, or Firm*—Jones Volentine, LLP

[57] ABSTRACT

A stacking and soldering apparatus for a three dimensional stack package devices includes a first base plate for receiving the first individual package devices to be stacked and having a heater for heating metal lead portions of the first individual package devices and; a second base plate for receiving the second individual package devices to be stacked and having a heater for heating metal lead portions of the second individual package devices. A package loader is used for transferring the individual packages to the first and the second base plates; and a transferring device is used for transferring the first individual package devices in the first base plate to the second base plate. A flux applying tool applies a solder flux to the metal lead portions of the first individual package devices during the transfer from the first to the second base plate; and a pick up tool picks up and places the transferred first individual package devices onto the second individual package devices so that the metal lead portions of the first individual package devices are in contact with the metal lead portions of the second individual package device. A solder joint is formed between the metal lead portions of the two individuals packages, either by thermocompression of the pick up tool, or by heating of the second base plate.

15 Claims, 6 Drawing Sheets

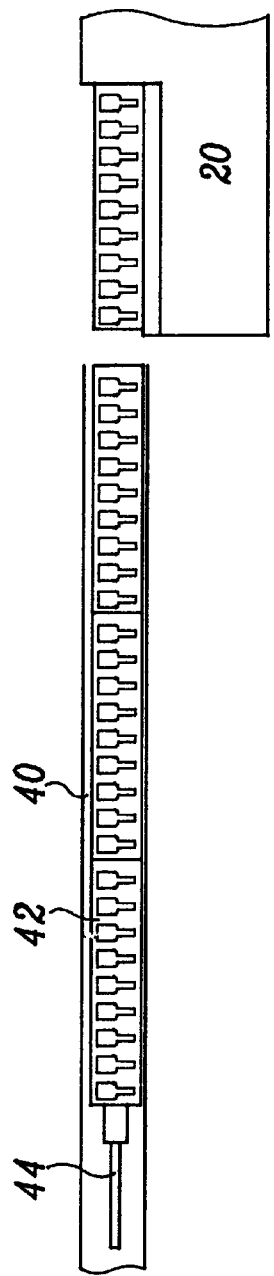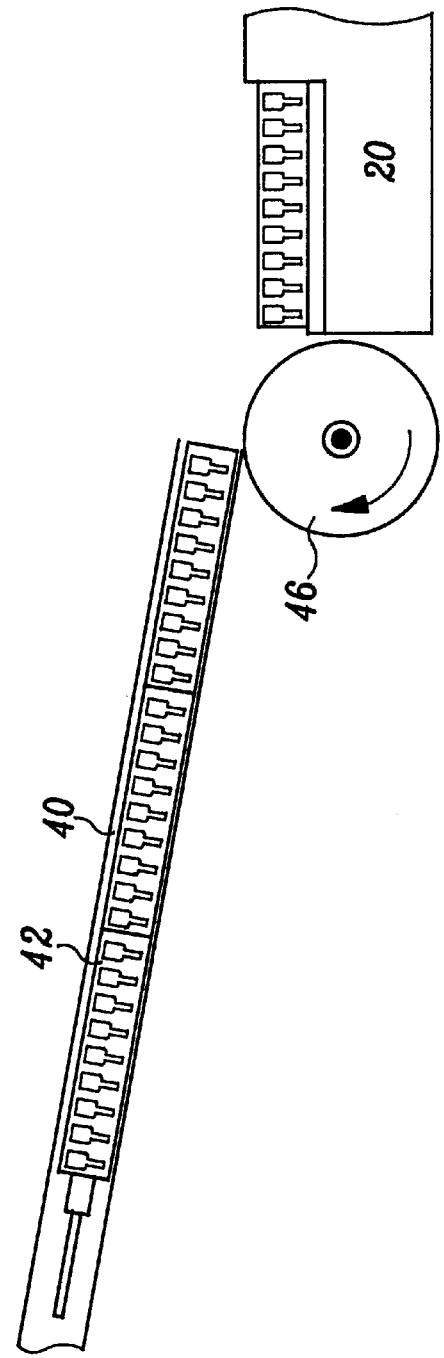

STACKING AND SOLDERING APPARATUS FOR THREE DIMENSIONAL STACK PACKAGE DEVICES

BACKGROUND OF THE INVENTION

1. Field of the Invention

The present invention relates generally to an apparatus for stacking and soldering individual package devices for a three dimensional stack package device, and more particularly to such a stacking and soldering apparatus allowing automatic stacking and soldering by applying solder flux to metal portions of the individual package devices during the transfer of the package devices.

2. Description of the Related Arts

In present packaging technology, a three dimensional stacking of several integrated circuit devices has attracted attention in order to meet demands of high density and increased capacity. The three dimensional stack package device can be obtained by stacking non-packaged semiconductor bare chips or by stacking packaged individual devices. When the packaged devices are stacked, most of the existing assembly processes such as a die attachment, a wire bonding and a molding can be applied to the individual packages prior to stacking. However, specific additional processes are necessary in stacking the individual package devices.

In the package stacking technology, it is an important factor how to electrically interconnect the stacked devices. A soldering method is one of the widely used methods for the electrical interconnection.

FIG. 1A is a schematic diagram of a conventional soldering apparatus which is disclosed in U.S. Pat. No. 5,236,117, and FIG. 1B is a detailed view of FIG. 1A. Package devices 12 to be stacked are applied with a flux, and then fixed to the left end of an impact arm 10. When the metal part, e.g., outer leads of the package devices are heated to a predetermined temperature, the packages 12 are dipped into a molten solder fountain 8. The impact arm 10 is pivotally mounted on pivot assembly 6, which allows the left end of the impact arm holding the package device to move upward and downward. The impact arm 10a in an elevated position and the impact arm 10b in the lowered position are shown in FIG. 1A. When the impact arm 10 moves to its lower position, the outer leads of the package are dipped into the molten solder in the fountain 8. The height stopper 2 is to set the lowered position of the impact arm. Vibration means 4 is to vibrate the impact arm 10 in order to prevent solder voids or lack of solder tinning of closely spaced leads.

With this dipping technique, the solder application can be performed more efficiently. However, when the lead pitch gets finer as the package device requires more and more I/O pins, a solder bridge and therefore electrical shorting actions can occur. For solving these problems, impact weight 9 drops onto the top of the opposite end of the impact arm 10. Therefore, the package device and the impact arm are rapidly returned to the upper position, so that all of the excess molten solder is removed from the leads. The movement of the impact weight 9 is controlled by an air cylinder 7 which in turn may be controlled by a programmable controller.

In the conventional soldering apparatus explained above, loading process of the vertically stacked individual packages to the apparatus is performed manually. On the other hand, J-lead type individual packages such as SOJ (Small Outline J-bend), TSOJ (Thin SOJ) and PLCC (Plastic Leaded Chip Carrier) are suitably applied to the soldering for vertical interconnection of the three dimensional stack package device. Thus, if an automated stacking and soldering apparatus is provided for the exclusive use for the J-lead type packages, the mass production of the stack package device can be possible.

SUMMARY OF THE INVENTION

It is an object of the present invention to provide a stacking and soldering apparatus which can automate the assembly process of three dimensional stack package device for improving the production yield.

It is another object of the present invention to provide an automated stacking and soldering apparatus which is exclusively used for a three dimensional stack package device employing J-lead type packages.

According to a significant aspect of the present invention, there is provided a stacking and soldering apparatus for a three dimensional stack package device, the stacking and soldering apparatus comprises: a first base plate for receiving a plurality of first individual package devices to be stacked and having a first heating means for heating metal lead portions of the first individual package devices; a second base plate for receiving a plurality of second individual package devices to be stacked and having a second heating means for heating metal lead portions of the second individual package devices; a package loading means for transferring the packages to the first and the second base plates; a transferring means for transferring the first individual package devices in the first base plate to the second base plate; a flux applying means for applying a solder flux to the metal lead portions of the first individual package devices during the transfer; and a pick up tool for picking up and placing the transferred first individual package devices on the second individual package devices so that the metal lead portions of the first individual package devices are in contact with the metal lead portions of the second individual package device, wherein said metal lead portions of the first and the second individual package devices are bent in a J-shape.

If the metal lead portions of the individual packages to be stacked are plated with a tin-lead solder alloy of 85 percent tin and 15 percent lead composition in outer lead plating process, the flux such as a rosin base flux and a water soluble flux can be applied to the metal leads during the transportation of the individual packages by the transferring means. While, if the solder alloy of eutectic composition is plated to the metal leads in outer lead plating process, the metal leads are applied with a solder paste during the transportation of the pacakges, rather than the flux.

The transferring means comprises a transfer rail directly contacting with bottom surfaces of the first individual package devices, and a third heating means for heating the metal lead portions of the first individual package devices, and the flux applying means comprises a fountain containing the molten flux or the molten solder paste, and a roller wheel having a brush attached to a circumference of the roller wheel, the roller wheel being partly dipped into the fountain and rotating so that the molten solder flux or the molten solder paste is applied to the metal lead portions of the first individual package devices when the first individual package devices are transferred.

BRIEF DESCRIPTION OF THE DRAWINGS

FIGS. 4A and 4B are schematic diagrams for illustrating a process for loading individual package devices contained in a carrier tube to a base plate according to the present invention;

DETAILED DESCRIPTION OF THE PREFERRED EMBODIMENTS

Figure 1A:
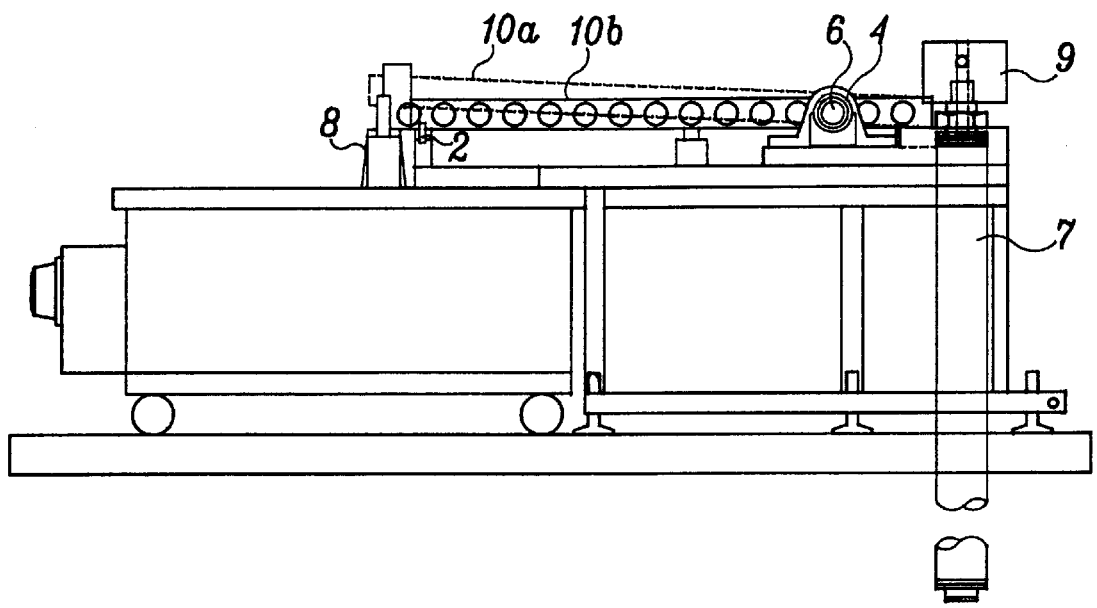
FIG. 1A is a schematic diagram of a conventional soldering apparatus disclosed in U.S. Pat. No. 5,236,117.
Figure 1B:
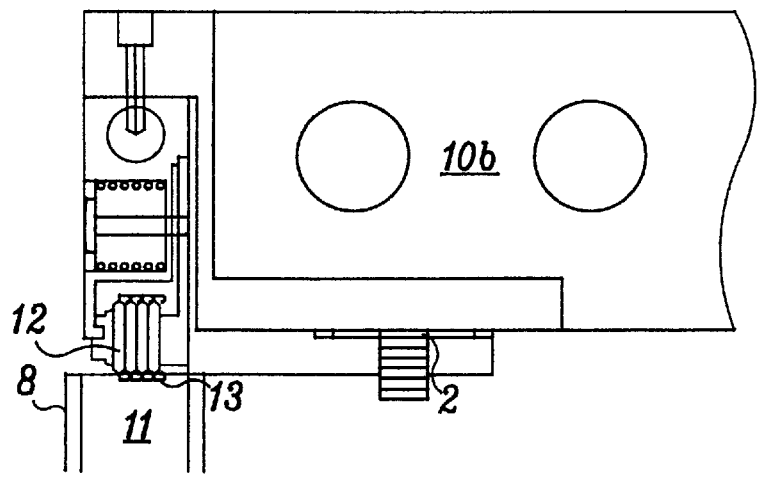
FIG. 1B is a detailed view of FIG. 1A.
Figure 2A:
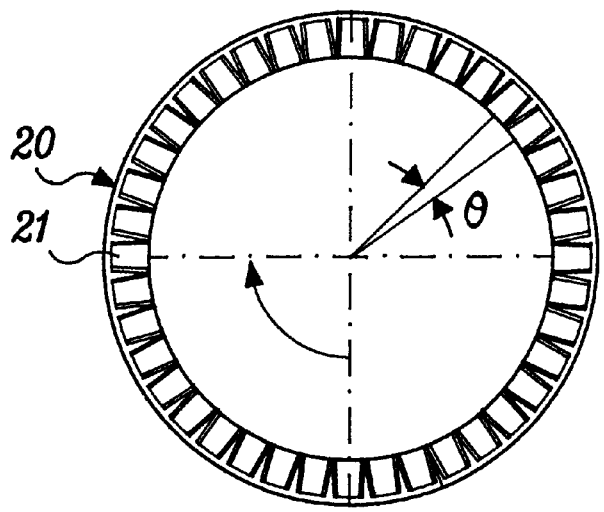
FIGS. 2A and 2B are a plan view and a front view of a base plate suitable for use in a stacking and soldering apparatus of the present invention, respectively.
Figure 2B:
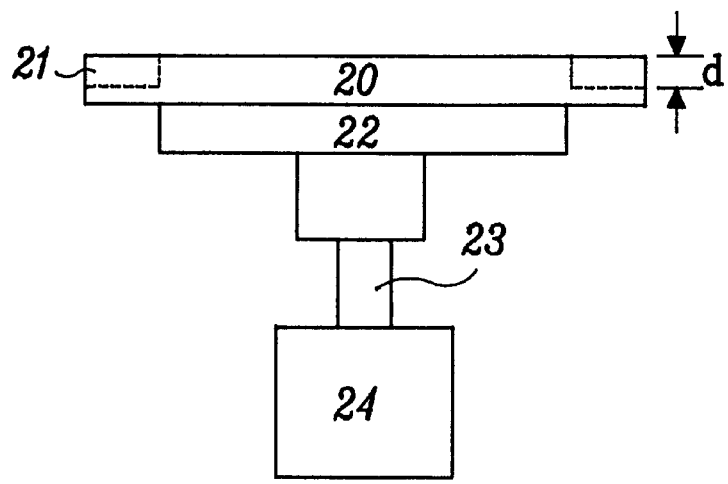

FIGS. 2A and 2B show a base plate used in a stacking and soldering apparatus of the present invention. The base plate 20 may have an internal heater (not shown) and a plurality of grooves 21 for receiving individual packages to be stacked. Under the base plate 20 there is provided a thermal insulating element 22 for blocking the heat to be transferred downward and a motor 24, e.g., a stepping motor connected to the base plate via a shaft 23, so that the base plate can turn. The unit of the revolution of the base plate 20 by the motor 24 is determined by an angle θ for rotating the grooves one by one in which individual packages to be stacked are contained. For example, if one quarter of the base plate has thirteen grooves, the angle θ will be approximately 6.92 degrees.

The internal heat is to heat the metal lead parts of the package device to a temperature below a melting point of a solder Alloy, e.g., to 180° C. for facilitating the soldering process. Instead of the internal heater for heating the metal lead parts, graphite or nickel-chromium (Ni—Cr) alloy may be used as a substance for forming the base plate. If the base plate of graphite or Ni—Cr alloy is used as an electrode, the base plate can be heated without any additional heater. For the base plate, a material which is not solderable is preferably selected.

The grooves 21 have a width larger than the width of an individual package body plus the length of lateral protrusion of the metal lead parts from the individual package body for accommodating the individual packages. The depth 'd' of the grooves 21 is equal to or greater than the height of the individual package.

Figure 3:
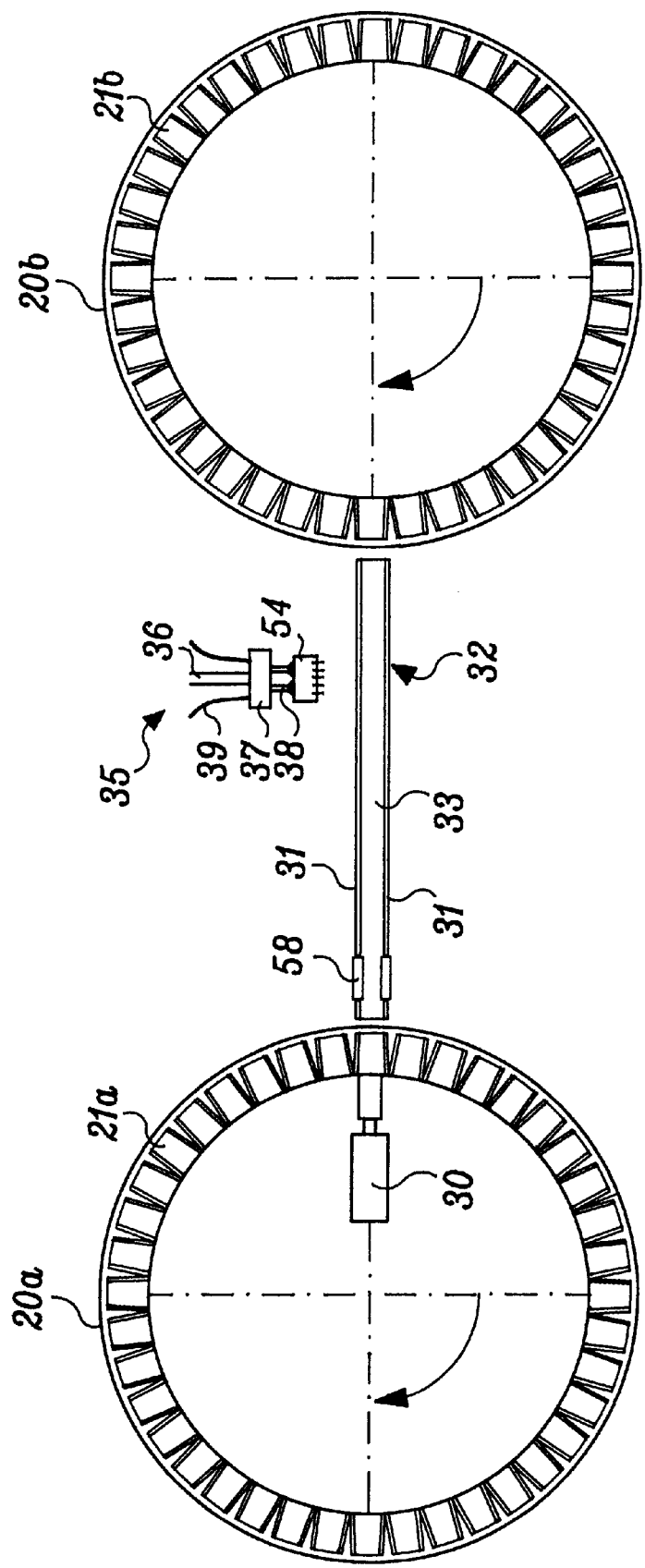
FIG. 3 is a partial plan view of a stacking and soldering apparatus of the present invention.

FIG. 3 shows an essential part of the stacking and soldering apparatus of the present invention. There are two base plates: one is a first base plate 20a and the other is a second base plate 20b. The individual packages to be stacked are moved from the first base plate 20a to the second base plate 20b along a transfer rail 33 of a transferring tool 32. When the first base plate 20a rotates, the individual package contained in the grooves 21a also rotates, e.g., in a clockwise direction. If a certain package to be transferred arrives at a location of a pusher 30, the pusher 30 pushes the package toward the transferring tool 32. The transferring tool 32 comprises the transfer rail 33 directly contacting with the bottom surface of the package body, a heater 31 for heating metal lead parts of the package, and a roller wheel 58 for applying a solder flux to the heated metal leads of the package while the individual packages are transferred. The transfer rail 33 is higher than the heater 31, so that the metal leads cannot contact the surface of the heater 31 during transportation of the package. The solder alloy applied to the metal leads can maintain its molten state by the heater 31 heated to about 209° C.

When the individual package is transferred to the right end of the transferring tool 32, a pick up tool 35 picks up the package and moves it toward the second base plate 20b. The pick up tool 35 is composed of a collet 37 and an arm 36 coupled to the collet 37. The pick up tool 35 may have a collet with an elastomer so that when the collet holds the package, a constant force can be put on the package body. Alternatively, the collet has, as shown in FIG. 3, vacuum pads 38 to regulate the holding force by controlling the vacuum force supplied through vacuum hoses 39. The pick up tool 35 takes a role of stacking the individual package transferred from the first base plate 20a along the transfer rail 33 onto another individual package contained in grooves 21b of the second base plate 20b. At this time, the accurate aligning of the individual packages is important so that the metal lead parts of the packages contact each other. Because the pick up tool 35 is heated to a temperature above the melting point of the solder alloy and presses down onto the top of the stacked packages, the metal lead parts are solder jointed. The pressure of the pick up tool needs to be high enough to prevent the two packages from separating or a weak joint being informed.

Alternatively to the soldering being accomplished by thermo-compression of the pick up tool, metal leads of the two stacked packages may be soldered by heating the second base plate and/or by feeding hot air into the grooves 21b while the second base plate turns.

FIGS. 4A and 4B show the process for loading individual packages contained in a carrier tube to a base plate. In FIG. 4A, the individual packages 42 in the tube 40 are pushed and loaded on the base plate 20 by a pusher 44. Referring to FIG. 4B, the individual packages 42 slide down by the gravitational force and are loaded one after another to the base plate by using rotating rubber wheel 46. Alternative to this carrier tube loading, tray loading approaches can be applied as explained below.

Figure 5A:
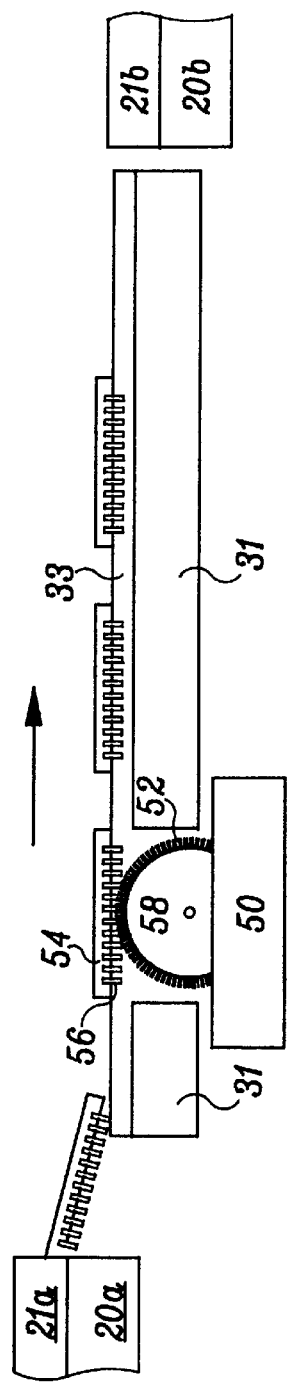
FIGS. 5A and 5B are a partial side view and a partial front view of a stacking and soldering apparatus of the present invention for illustrating a process for applying a solder flux to metal lead portions of package devices.
Figure 5B:
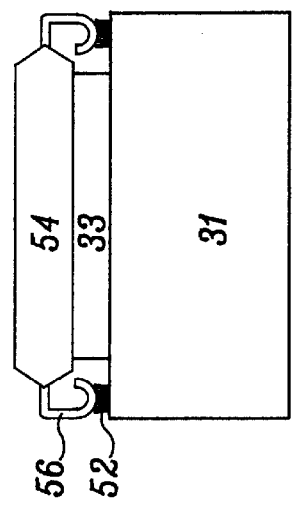

FIGS. 5A and 5B show the process for applying a solder flux to the metal lead portions of individual packages. As explained before, the individual packages 54 are moved from the grooves 21a of the first base plate 20a to the grooves 21b of the second base plate 20b. A molten flux fountain 50 is located such that so the brush 52 of the rotating roller wheel 34 applies the solder flux to the metal lead portions 56 of the moving individual packages. The metal leads 56 are bent in a J-shape, so that the metal leads plated with a solder alloy of the package to be stacked can contact shoulders of metal leads of the lower individual package contained in the grooves 21b.

The flux contained in the fountain 50 is to clean the metal lead surfaces to be solder jointed and prevent oxidation of the metal leads at the elevated temperatures used in soldering. Further, the flux makes the molten solder alloy wet the surfaces of the metals to be joined. The flux can be either: a rosin base flux or a water soluble flux. The rosin is a naturally occurring substance extracted from pine trees.

To the metal leads of the individual packages, a tin-lead solder alloy is already deposited by an outer lead plating process which is typically used in the plastic package assembly. The solder alloy is normally composed of tin and lead in ratios close to the eutectic point, e.g., 63 percent tin and 37 percent lead. The eutectic composition is a distinct alloy composition that has a single melting point, rather than a discrete melting range. On the other hand, because the individual packages are not mounted on Printed Circuit Boards in the present invention, it is preferable to carry out the outer lead plating process using a solder alloy composed of 85 percent tin and 15 percent lead. By doing this, the melting point of the solder alloy is raised, and the metal leads of the upper and the lower individual packages can be solder jointed simply by applying the flux to the metal leads.

Because tin is much costlier higher than lead, solder alloy cost is basically a function of amount of tin in the alloy. The higher the tin content, the higher the cost. Accordingly, in order to reduce the cost, the metal leads of the individual packages are plated with a solder alloy of the eutectic composition in the outer lead plating process and the stacking and soldering apparatus of the present invention applies a solder paste instead of the flux to the metal leads. At this time the solder paste is contained in molten state in the fountain 50. The solder paste is generally composed of the solder alloy and the flux.

Figure 6:
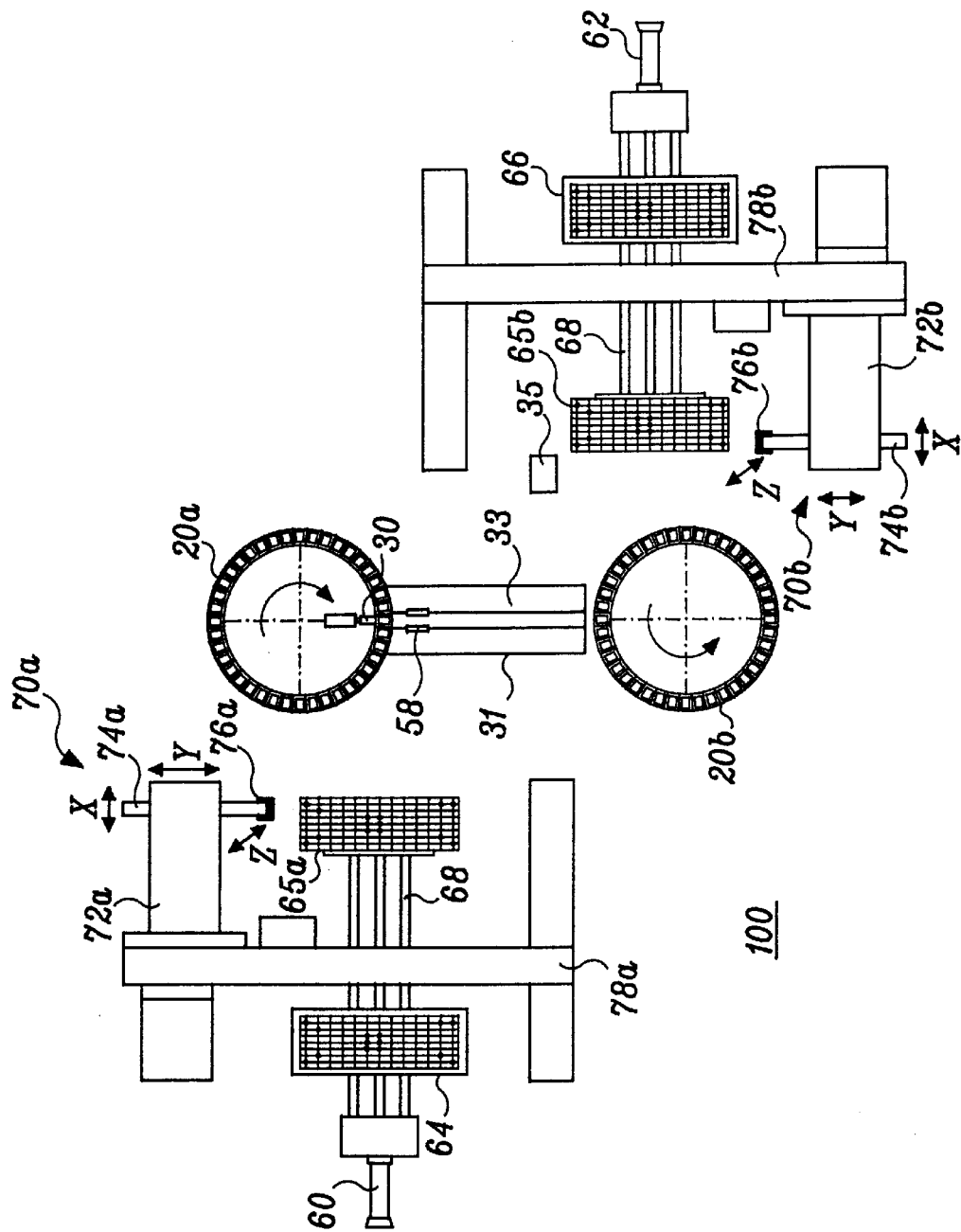
FIG. 6 is a schematic plan view of a stacking and soldering apparatus of the present invention.

FIG. 6 is a schematic plan view of the stacking and soldering apparatus according to the present invention. The individual packages to be stacked are contained in a first tray 65a and a second tray 65b which are stacked in tray stacker 64. Tray loaders 60 and 62 transfer the trays stacked in the tray stacker 64 toward the base plates 20a and 20b along rail 68. The individual packages in the first and the second trays 65a and 65b are moved to the grooves on the first and the second base plates 20a and 20b by a first and a second package loader 70a and 70b. Each of the first and the second package loaders 70a and 70b is connected to a support beam 78, and comprises a master arm 72 rectilinearly moving in the y-direction, a slave arm 74 rectilinearly moving in the x-direction, and a pick up pad 76 moving up and down in the z-direction. The pick up pad 76 picks up the packages by a vacuum force.

The packages in the first base plate 20a are fed to the transfer rail 33 by the pusher 30. As explained before, the metal lead portions of the individual packages are plated with the flux or the solder paste by the rotating roller wheel 58 during the transportation of the packages along the transfer rail 33 toward the second base plate 20b.

The packages plated with the flux or the solder paste are transferred to the second base plate 20b by the pick up tool 35 shown in FIG. 3. At this time, the plated packaged are stacked on top of other packages already contained in the grooves of the second base plate 20b. After the metal leads of the stacked packages are soldered and joined, the stack packages are transferred to the second tray 65b by the second package loader 70b. As understood from the above description, in the first tray 65a, only a loading operation is done for loading the individual packages to be stacked onto the first base plate 20a, while in the second tray 65b, two operations are carried out, i.e., a loading operation for loading the individual packages to be stacked onto the second base plate 20b and an unloading operation for transferring the stacked packages to the second tray 65b.

While in FIG. 6, the stacking and soldering apparatus 100 employs the tray loading scheme, tube 40 and pusher 44 as shown in FIG. 4A or tube 40 and rubber wheel 46 as shown in FIG. 4B can be used for loading the individual packages onto the first and the second base plates.

As explained above, the present invention, in which the individual package devices to be stacked are aligned and stacked automatically in a single processing line after the individual devices are plastic-packaged, can provide even more simple assembly for three dimensional stack package. The present invention also reduces the time required for the soldering and various types of packages can be stacked simply by changing a jig.

While the above provides a full and complete disclosure of the preferred embodiments of the present invention, various modifications, alternate constructions and equivalents may be employed as desired. Therefore, the above description and illustrations should not be construed as limiting the present invention, which is defined by the appended claim.

What is claimed is:

1. A stacking and soldering apparatus for a three dimensional stack package device, said stacking and soldering apparatus comprises:

a first base plate for receiving a plurality of first individual package devices to be stacked and having a first heating means for heating metal lead portions of the first individual package devices;

a second base plate for receiving a plurality of second individual package devices to be stacked and having a second heating means for heating metal lead portions of the second individual package devices;

a first and a second package loading means for transferring the first and the second individual package devices to the first and the second base plates;

a transferring means for transferring the first individual package devices in the first base plate to the second base plate;

a flux applying means for applying a solder flux to the metal lead portions of the first individual package devices during transfer by the transferring means; and a pick up means for picking up the first individual package devices from the transferring means and placing the first individual package devices onto the second individual package devices on the second base plate so that the metal lead portions of the first individual package devices are in contact with metal lead portions of the second individual package devices.

2. The stacking and soldering apparatus as claimed in claim 1, wherein each of the first and the second base plates has a plurality of grooves for receiving the first and the second individual package devices, each groove of the first base plate having a depth equal to a thickness of the first individual package device, and each groove of the second base plate having a depth equal to a thickness of the three dimensional stack package device.

3. The stacking and soldering apparatus as claimed in claim 1, wherein each of the first and second package loading means comprises a master arm rectilinearly moving along a Y-axis direction, a slave arm connected to the master arm and rectilinearly moving along an X-axis direction, and a pick up pad connected to the slave arm and moving along a Z-axis direction, said pick up pad picking up the individual package devices by a vacuum force.

4. The stacking and soldering apparatus as claimed in claim 1, wherein each of the first and second package loading means comprises a carrier tube containing the individual package devices to be stacked and a pushing means for pushing and transferring the individual package devices to the first and second base plates.

5. The stacking and soldering apparatus as claimed in claim 1, wherein each of the first and second package loading means comprises a carrier tube containing the individual package devices to be stacked and a rubber wheel for transferring the individual package devices to the first and second base plates.

6. The stacking and soldering apparatus as claimed in claim 1, wherein the first and the second base plates are circular shaped and connected to motors so that the first and second base plates rotate.

7. The stacking and soldering apparatus as claimed in claim 1, wherein the first base plate further comprises a pushing means for transferring the first individual package devices to the transferring means.

8. The stacking and soldering apparatus as claimed in claim 1, wherein the transferring means comprises a transfer rail directly contacting bottom surfaces of the first individual package devices, and a third heating means for heating the metal lead portions of the first individual package devices, and wherein the flux applying means comprises a molten flux fountain, and a roller wheel having a brush attached to a circumference of the roller wheel, said roller wheel being partly dipped into the molten flux fountain and rotating so that the molten flux is applied to the metal lead portions of the first individual package devices while the first individual package devices are being transferred from the first base plate to the second base plate.

9. The stacking and soldering apparatus as claimed in claim 1, wherein the first and the second individual package devices have metal leads bent in a J-shape and the metal leads are plated with a tin-lead alloy.

10. The stacking and soldering apparatus as claimed in claim 7, wherein the pick up means compresses the first individual package devices and heats the metal lead portions of the first and second individual package devices to above a melting point of the tin-lead alloy while placing the first individual package devices onto the second individual package devices.

11. The stacking and soldering apparatus as claimed in claim 10, wherein the first and the second individual package devices have metal leads bent in a J-shape and the metal leads are plated with a tin-lead alloy.

12. A stacking and soldering apparatus for a three dimensional stack package device, said stacking and soldering apparatus comprises:

a first base plate for receiving a plurality of first individual package devices to be stacked and having a first heating means for heating metal lead portions of the first individual package devices;

a second base plate for receiving a plurality of second individual package devices to be stacked and having a second heating means for heating metal lead portions of the second individual package devices;

a first and a second package loading means for transferring the first and the second individual package devices to the first and the second base plates;

a transferring means for transferring the first individual package devices in the first base plate to the second base plate;

a solder paste applying means for applying a solder paste to the metal lead portions of the first individual package devices during transfer by the transferring means; and a pick up means for picking up the first individual package devices from the transferring means and placing the first individual package devices onto the second individual package devices on the second base plate so that the metal lead portions of the first individual package devices are in contact with metal lead portions of the second individual package devices.

13. The stacking and soldering apparatus as claimed in claim 7, wherein the tin-lead alloy is 85 percent tin and 15 percent lead.

14. The stacking and soldering apparatus as claimed in claim 12, wherein the transferring means comprises a transfer rail directly contacting bottom surfaces of the first individual package devices, and a third heating means for heating the metal lead portions of the first individual package devices, and wherein the solder paste applying means comprises a molten solder paste fountain, and a roller wheel having a brush attached to a circumference of the roller wheel, said roller wheel being partly dipped into the molten solder paste fountain and rotating so that the molten solder paste is applied to the metal lead portions of the first individual package devices while the first individual package devices are being transferred from the first base plate to the second base plate.

15. The stacking and soldering apparatus as claimed in claim 13, wherein the tin-lead alloy is 63 percent tin and 37 percent lead.

* * * * *